(12) United States Patent
Gunnam

(10) Patent No.: US 8,359,515 B2
(45) Date of Patent: Jan. 22, 2013

(54) FORWARD SUBSTITUTION FOR ERROR-CORRECTION ENCODING AND THE LIKE

(75) Inventor: Kiran Gunnam, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 510 days.

(21) Appl. No.: 12/644,181

(22) Filed: Dec. 22, 2009

(65) Prior Publication Data

US 2011/0131463 A1 Jun. 2, 2011

Related U.S. Application Data

(60) Provisional application No. 61/265,826, filed on Dec. 2, 2009, provisional application No. 61/265,836, filed on Dec. 2, 2009.

(51) Int. Cl.
*G06F 11/00* (2006.01)
(52) U.S. Cl. ...................................................... 714/752
(58) Field of Classification Search .................... None
See application file for complete search history.

(56) References Cited

U.S. PATENT DOCUMENTS

| | | | |
|---|---|---|---|
| 6,961,888 B2 | 11/2005 | Jin et al. | |
| 7,139,959 B2 | 11/2006 | Hocevar | |
| 7,162,684 B2 | 1/2007 | Hocevar | |
| 7,181,676 B2 | 2/2007 | Hocevar | |
| 7,237,171 B2 * | 6/2007 | Richardson | 714/752 |
| 7,313,752 B2 | 12/2007 | Kyung et al. | |
| 7,607,075 B2 | 10/2009 | Blankenship et al. | |
| 7,856,579 B2 | 12/2010 | Zheng | |
| 7,934,139 B2 | 4/2011 | Andreev et al. | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0107181 A1 | 5/2006 | Dave et al. | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |

(Continued)

FOREIGN PATENT DOCUMENTS

WO WO 2010/019168 A1 2/2010

OTHER PUBLICATIONS

Vila Casado, Andres I., Weng, Wen-Yen and Wesel, Richard D. "Multiple Rate Low-Density Parity-Check Codes with Constant Blocklength," IEEE 2004, pp. 2010-2014.

(Continued)

*Primary Examiner* — Michael Maskulinski
(74) *Attorney, Agent, or Firm* — Mendelsohn, Drucker & Associates, P.C.; Craig M. Brown; Steve Mendelsohn

(57) ABSTRACT

In one embodiment, a forward substitution component performs forward substitution based on a lower-triangular matrix and an input vector to generate an output vector. The forward substitution component has memory, a first permuter, an XOR gate array, and a second permuter. The memory stores output sub-vectors of the output vector. The first permuter permutates one or more previously generated output sub-vectors stored in the memory based on one or more permutation coefficients corresponding to a current block row of the lower-triangular matrix to generate one or more permuted sub-vectors. The XOR gate array performs exclusive disjunction on (i) the one or more permuted sub-vectors and (ii) a current input sub-vector of the input vector to generate an intermediate sub-vector. The second permuter permutates the intermediate sub-vector based on a permutation coefficient corresponding to another block in the current block row to generate a current output sub-vector of the output vector.

20 Claims, 10 Drawing Sheets

U.S. PATENT DOCUMENTS

| | | |
|---|---|---|
| 2007/0071009 A1 | 3/2007 | Nagaraj et al. |
| 2007/0124652 A1 | 5/2007 | Litsyn et al. |
| 2007/0147481 A1 | 6/2007 | Bottomley et al. |
| 2007/0162788 A1 | 7/2007 | Moelker |
| 2007/0234178 A1 | 10/2007 | Richardson et al. |
| 2007/0234184 A1 | 10/2007 | Richardson |
| 2008/0082868 A1 | 4/2008 | Tran et al. |
| 2008/0104485 A1 | 5/2008 | Lyakh et al. |
| 2008/0109701 A1 | 5/2008 | Yu et al. |
| 2008/0126910 A1 | 5/2008 | Venkatesan et al. |
| 2008/0134000 A1* | 6/2008 | Wiatrowski et al. .......... 714/758 |
| 2008/0148129 A1 | 6/2008 | Moon |
| 2008/0163032 A1 | 7/2008 | Lastras-Montano |
| 2008/0235561 A1 | 9/2008 | Yang |
| 2008/0276156 A1 | 11/2008 | Gunnam et al. |
| 2008/0301521 A1 | 12/2008 | Gunnam et al. |
| 2009/0273492 A1 | 11/2009 | Yang et al. |
| 2010/0042806 A1 | 2/2010 | Gunnam |
| 2010/0042890 A1 | 2/2010 | Gunnam |
| 2010/0180176 A1* | 7/2010 | Yosoku et al. ................ 714/752 |

OTHER PUBLICATIONS

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block-LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version— Oct. 18, 2007, pp. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, ShaohuaYang and Yuanxing Lee—"Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R. Michael Tanner—"A Recursive Approach to Low Complexity Codes", IEEE transaction on Information Theory, Sep. 1981, pp. 533-547, vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698, vol. 41, No. 3.

Badri N. Vellambi R, and Faramarz Fekri, "An Improved Decoding Algorithm for Low-Density Parity-Check Codes over the Binary Erasure Channel", IEEE Globecom 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

* cited by examiner $$H = \begin{Bmatrix} \underbrace{\begin{matrix} B_{1,1} & B_{1,2} & B_{1,3} & B_{1,4} & B_{1,5} & B_{1,6} \\ B_{2,1} & B_{2,2} & B_{2,3} & B_{2,4} & B_{2,5} & B_{2,6} \\ B_{3,1} & B_{3,2} & B_{3,3} & B_{3,4} & B_{3,5} & B_{3,6} \\ B_{4,1} & B_{4,2} & B_{4,3} & B_{4,4} & B_{4,5} & B_{4,6} \\ B_{5,1} & B_{5,2} & B_{5,3} & B_{5,4} & B_{5,5} & B_{5,6} \\ B_{6,1} & B_{6,2} & B_{6,3} & B_{6,4} & B_{6,5} & B_{6,6} \end{matrix}}_{H_u,\ n-m=6} \underbrace{\begin{matrix} B_{1,7} & B_{1,8} & B_{1,9} & B_{1,10} & B_{1,11} & B_{1,12} \\ B_{2,7} & B_{2,8} & B_{2,9} & B_{2,10} & B_{2,11} & B_{2,12} \\ B_{3,7} & B_{3,8} & B_{3,9} & B_{3,10} & B_{3,11} & B_{3,12} \\ B_{4,7} & B_{4,8} & B_{4,9} & B_{4,10} & B_{4,11} & B_{4,12} \\ B_{5,7} & B_{5,8} & B_{5,9} & B_{5,10} & B_{5,11} & B_{5,12} \\ B_{6,7} & B_{6,8} & B_{6,9} & B_{6,10} & B_{6,11} & B_{6,12} \end{matrix}}_{H_p,\ m=6} \end{Bmatrix} n=12$$

FORWARD SUBSTITUTION FOR ERROR-CORRECTION ENCODING AND THE LIKE

CROSS-REFERENCE TO RELATED APPLICATIONS

This application claims the benefit of the filing dates of U.S. provisional application No. 61/265,826, filed on Dec. 2, 2009 as , and U.S. provisional application No. 61/265,836, filed on Dec. 2, 2009 as, the teachings both of which are incorporated herein by reference in their entirety.

The subject matter of this application is related to:
U.S. patent application Ser. No. 12/113,729 filed May 1, 2008,
U.S. patent application Ser. No. 12/113,755 filed May 1, 2008,
U.S. patent application Ser. No. 12/323,626 filed Nov. 26, 2008,
U.S. patent application Ser. No. 12/401,116 filed Mar. 10, 2009,
PCT patent application no. PCT/US08/86523 filed Dec. 12, 2008,
PCT patent application no. PCT/US08/86537 filed Dec. 12, 2008,
PCT patent application no. PCT/US09/39918 filed Apr. 8, 2009,
PCT application no. PCT/US09/39279 filed on Apr. 2, 2009,
U.S. patent application Ser. No. 12/420,535 filed Apr. 8, 2009,
U.S. patent application Ser. No. 12/475,786 filed Jun. 1, 2009,
U.S. patent application Ser. No. 12/260,608 filed on Oct. 29, 2008,
PCT patent application no. PCT/US09/41215 filed on Apr. 21, 2009,
U.S. patent application Ser. No. 12/427,786 filed on Apr. 22, 2009,
U.S. patent application Ser. No. 12/492,328 filed on Jun. 26, 2009,
U.S. patent application Ser. No. 12/492,346 filed on Jun. 26, 2009,
U.S. patent application Ser. No. 12/492,357 filed on Jun. 26, 2009,
U.S. patent application Ser. No. 12/492,374 filed on Jun. 26, 2009,
U.S. patent application Ser. No. 12/538,915 filed on Aug. 11, 2009,
U.S. patent application Ser. No. 12/540,078 filed on Aug. 12, 2009,
U.S. patent application Ser. No. 12/540,035 filed on Aug. 12, 2009,
U.S. patent application Ser. No. 12/540,002 filed on Aug. 12, 2009,
U.S. patent application Ser. No. 12/510,639 filed on Jul. 28, 2009,
U.S. patent application Ser. No. 12/524,418 filed on Jul. 24, 2009,
U.S. patent application Ser. No. 12/510,722 filed on Jul. 28, 2009, and
U.S. patent application Ser. No. 12/510,667 filed on Jul. 28, 2009,
the teachings of all of which are incorporated herein by reference in their entirety.

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

Low-density parity-check (LDPC) encoding is an error-correction encoding scheme that has attracted significant interest in recent years due in part to its ability to operate near the Shannon limit and its relatively low implementation complexity. LDPC codes are characterized by parity-check matrices, wherein, in each parity-check matrix, the number of elements in the matrix that have a value of one is relatively small in comparison to the number of elements that have a value of zero. Over the last few years, various methods of performing LDPC encoding have been developed. For example, according to one relatively straightforward method, LDPC encoding may be performed by multiplying a generator matrix, derived from the parity-check matrix, by user data to generate LDPC codewords. A discussion of this and other LDPC encoding methods may be found in Richardson, "Efficient Encoding of Low-Density Parity-Check Codes, IEEE Transactions on Information Theory, Vol. 47, No. 2, pgs. 638-656, February 2001, and Thong, "Block LDPC: A Practical LDPC Coding System Design Approach," IEEE Transactions on Circuits and Systems: Regular Papers, Vol. 52, No. 4, pgs. 766-775, April 2005, the teachings all of which are incorporated herein by reference in their entirety.

SUMMARY OF THE INVENTION

In one embodiment, the present invention is an apparatus comprising a substitution component that performs substitution based on a triangular matrix and an input vector to generate an output vector. The substitution component comprises memory, a first permuter, an XOR gate array, and a second permuter. The memory stores output sub-vectors of the output vector. The first permuter permutates one or more previously generated output sub-vectors of the output vector based on one or more corresponding permutation coefficients to generate one or more permuted sub-vectors. The one or more permutation coefficients correspond to a current block row of the triangular matrix, and each permutation coefficient corresponds to a different sub-matrix in the current block row. The XOR gate array performs exclusive disjunction on (i) the one or more permuted sub-vectors and (ii) a current input sub-vector of the input vector to generate an intermediate sub-vector. The second permuter permutates the intermediate sub-vector based on a permutation coefficient corresponding to another sub-matrix in the current block row to generate a current output sub-vector of the output vector.

In another embodiment, the present invention is an encoder implemented method for performing substitution based on a triangular matrix and an input vector to generate an output vector. The method comprises storing in memory output sub-vectors of the output vector. One or more previously generated output sub-vectors of the output vector are permutated based on one or more corresponding permutation coefficients to generate one or more permuted sub-vectors. The one or more permutation coefficients correspond to a current block row of the triangular matrix, and each permutation coefficient corresponds to a different sub-matrix in the current block row. Exclusive disjunction is performed on (i) the one or more permuted sub-vectors and (ii) a current input sub-vector of the input vector to generate an intermediate sub-vector. The intermediate sub-vector is permutated based on a permutation coefficient corresponding to another sub-matrix in the current block row to generate a current output sub-vector of the output vector.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 1 shows one implementation of a parity-check matrix (aka H-matrix) that may be used to implement a low-density parity-check (LDPC) code;

FIG. 3 shows a simplified representation of an exemplary H-matrix in coefficient-matrix form;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

FIG. 1 shows one implementation of a parity-check matrix 100 that may be used to implement a low-density parity-check (LDPC) code. Parity-check matrix 100, commonly referred to as an H-matrix, comprises 72 sub-matrices (or blocks) $B_{j,k}$ that are arranged in m=6 rows (i.e., block rows) where j=1, ..., m and n=12 columns (i.e., block columns) where k=1, ..., n. Each sub-matrix $B_{j,k}$ has a number z of rows and a number z of columns (i.e., each sub-matrix $B_{j,k}$ is a z×z matrix), and therefore H-matrix 100 has M=m×z total rows and N=n×z total columns. In some relatively simple implementations, z=1 such that H-matrix 100 has M=6 total rows and N=12 total columns. In more complex implementations, z may be greater than 1. For more complex implementations, each sub-matrix may be a zero matrix, an identity matrix, a circulant that is obtained by cyclically shifting an identity matrix, or a matrix in which the rows and columns are arranged in a more-random manner than an identity matrix or circulant.

H-matrix 100 may be a regular H-matrix or an irregular H-matrix. A regular H-matrix is arranged such that all rows of the H-matrix have the same row hamming weight $w_r$, and all columns of the H-matrix have the same column hamming weight $w_c$. A row's hamming weight refers to the number of elements in the row having a value of 1. Similarly, a column's hamming weight refers to the number of elements in the column having a value of 1. An irregular H-matrix is arranged such that the row hamming weight $w_r$ of one or more rows differ from the row hamming weight $w_r$ of one or more other rows and/or the column hamming weight $w_c$ of one or more columns differ from the column hamming weight $w_c$ of one or more other columns.

An H-matrix may also be arranged in non-systematic form or systematic form. In non-systematic form, the elements of the H-matrix that correspond to user data are interspersed with the elements of the H-matrix that correspond to parity bits. In systematic form, the H-matrix is arranged such that all elements of the matrix corresponding to user data are separated from all elements of the matrix corresponding to parity bits. H-matrix 100 is an example of an H-matrix in systematic form. As shown, H-matrix 100 has (i) an m×(n−m) sub-matrix $H_u$ (to the left of the dashed line) corresponding to user data, and (ii) an m×m sub-matrix $H_p$ (to the right of the dashed line) corresponding to parity bits.

Figure 2:
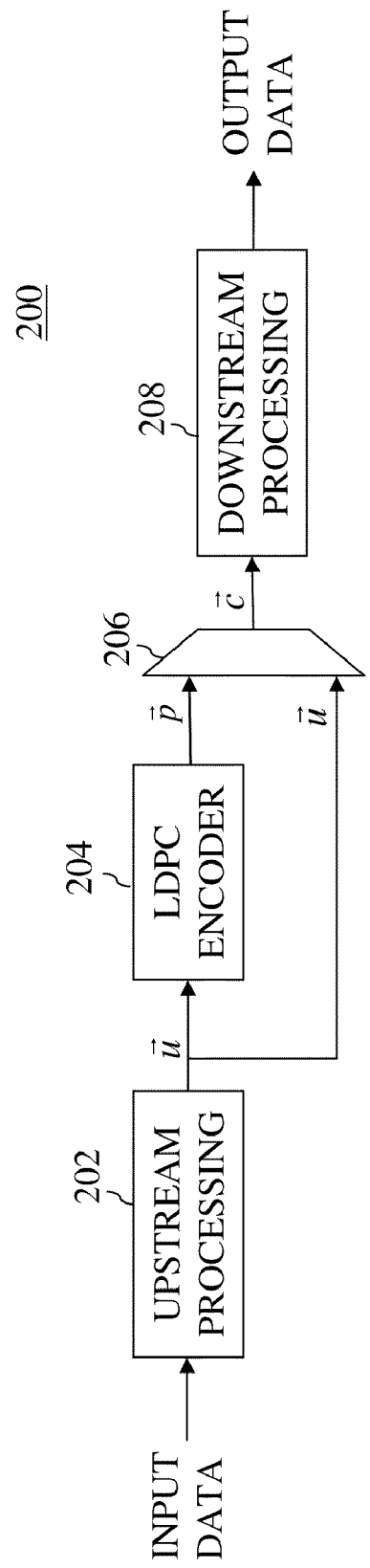
FIG. 2 shows a simplified block diagram of one implementation of a signal processing device that may be used to encode data using an H-matrix such as the H-matrix of FIG. 1.

FIG. 2 shows a simplified block diagram of one implementation of a signal processing device 200, which may be used to encode data using an H-matrix such as H-matrix 100 of FIG. 1. Signal processing device 200 may be implemented in a communications transmission system, a hard-disk drive (HDD) system, or any other suitable application. Upstream processing 202 of signal processing device 200 receives an input data stream from, for example, a user application, and generates a user-data vector $\vec{u}$ for low-density parity-check (LDPC) encoding. The processing performed by upstream processing 202 may vary from one application to the next and may include processing such as error-detection encoding, run-length encoding, or other suitable processing.

LDPC encoder 204 generates a parity-bit vector $\vec{p}$ based on the user-data vector $\vec{u}$ and a parity-check matrix (i.e., H-matrix) and outputs the parity-bit vector $\vec{p}$ to multiplexer 206. Multiplexer 206 receives the user-data vector $\vec{u}$ and inserts the parity bits of parity-bit vector $\vec{p}$ among the data bits of user-data vector $\vec{u}$ to generate a codeword vector $\vec{c}$. For example, according to one implementation, one nibble (four bits) of parity data from parity-bit vector $\vec{p}$ may be output after every ten nibbles (40 bits) of user data from user-data vector $\vec{u}$. Generally, the length of codeword vector $\vec{c}$ is the same as the number of columns of the parity-check matrix. For example, if LDPC encoder 204 performs encoding based on H-matrix 100 of FIG. 1, which has M=6×z total rows, then codeword vector $\vec{c}$ will have M=6×z total elements. The codeword vector $\vec{c}$ is then processed by downstream processing 208, which performs processing such as digital-to-analog conversion, pre-amplification, and possibly other suitable processing depending on the application.

The processing performed by LDPC encoder 204 to generate parity-bit vector $\vec{p}$ may be derived beginning with the premise that the modulo-2 product of the H-matrix and the codeword vector $\vec{c}$ is equal to zero as shown in Equation (1):

$$H\vec{c}=0 \qquad (1)$$

If the H-matrix of Equation (1) is in systematic form, then Equation (1) may be rewritten as shown in Equation (2):

$$H\vec{c} = [H_u \quad H_p]\begin{bmatrix}\vec{u}\\\vec{p}\end{bmatrix} = 0, \qquad (2)$$

where $H_u$ is an m×(n−m) sub-matrix of H corresponding to user data, $H_p$ is an m×m sub-matrix of H corresponding to parity-check bits, $\vec{u}$ is an (n−m)×1 user-data vector, and $\vec{p}$ is an m×1 parity-bit vector.

Equation (2) may be rewritten as shown in Equation (3):

$$H_p\vec{p}=H_u\vec{u}, \qquad (3)$$

and Equation (3) may be solved for parity-bit vector $\vec{p}$ as shown in Equation (4):

$$\vec{p}=[H_p]^{-1}[H_u\vec{u}]. \qquad (4)$$

Substituting $\vec{x}=H_u\vec{u}$ into Equation (4) yields Equation (5) as follows:

$$\vec{p}=[H_p]^{-1}\vec{x} \qquad (5)$$

Using Equation (5), parity-bit vector $\vec{p}$ may be generated by (i) multiplying sub-matrix $H_u$ by user-data vector $\vec{u}$ to generate vector $\vec{x}$, (ii) determining the inverse $[H_p]^{-1}$ of sub-matrix $H_p$, and (iii) multiplying vector $\vec{x}$ by $[H_p]^{-1}$.

Sparse-Matrix-Vector Multiplication

Figure 3:
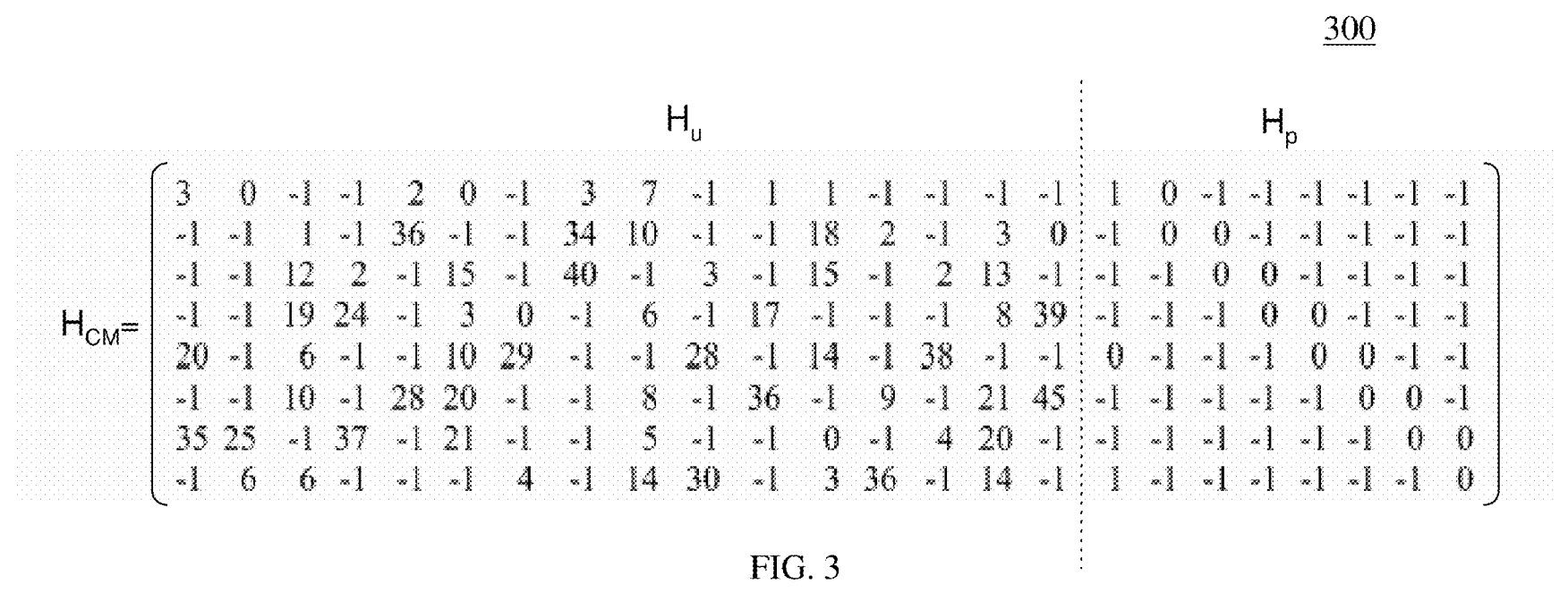

Suppose that user-data sub-matrix $H_u$ is sparse. Vector $\vec{x}$ may be generated by permutating sub-vectors $\vec{u}_n$ of user-data vector $\vec{u}$ and applying the permutated sub-vectors $\vec{u}_n$ to XOR logic. As an example, consider exemplary H-matrix 300 of FIG. 3. H-matrix 300 is depicted in coefficient-matrix (CM) form, where each element $P_{j,k}$ of H-matrix 300 corresponds to a block (i.e., a sub-matrix). H-matrix 300 is also arranged in systematic form having an 8×16 user-data sub-matrix $H_u$ and an 8×8 parity-bit sub-matrix $H_p$. H-matrix 300 has 192 total blocks arranged in n=24 block columns (i.e., j=1, . . . , 24) and m=8 block rows (i.e., k=1, . . . , 8). Each element $P_{j,k}$ of H-matrix 300, herein referred to as a permutation coefficient $P_{j,k}$, that has a positive value or a value of zero represents that the block is a z×z weight one matrix that is permutated by the value (or not permutated in the case of a zero). A weight one matrix is a matrix in which each row and each column has a hamming weight of one. Such matrices include identity matrices and matrices in which the ones are arranged in a more random manner than an identity matrix. Each permutation coefficient $P_{j,k}$ that has a value of negative one indicates that the block is a z×z zero matrix. Thus, for example, the permutation coefficient $P_{j,k}$ in the first block row and first block column (i.e., upper left-most element of H-matrix 300) indicates that the corresponding block is a z×z weight one matrix that is permutated by 3.

Each weight one matrix may be permutated using, for example, cyclic shifting or permutations that are more random, such as those obtained using an Omega network or a Benes network. In the case of cyclic shifting, cyclic shifting of the weight one matrices may be selected by the designer of the coefficient matrix to be right, left, up, or down cyclic shifting. An Omega network, which is well known to those of ordinary skill in the art, is a network that receives z inputs and has multiple interconnected stages of switches. Each switch, which receives two inputs and presents two outputs, can be set based on a bit value to (i) pass the two inputs directly to the two outputs in the order they were received (e.g., top input is provided to top output and bottom input is provided to bottom output) or (ii) swap the two inputs (e.g., such that the top input is provided to the bottom output, and vice versa). The outputs of each stage are connected to the inputs of each subsequent stage using a perfect shuffle connection system. In other words, the connections at each stage are equivalent to dividing z inputs into two equal sets of z/2 inputs and then shuffling the two sets together, with each input from one set alternating with the corresponding input from the other set. For z inputs, an Omega network is capable of performing $2^z$ different permutations, and each permutation coefficient $P_{j,k}$ is represented by $(z/2)\log_2(z)$ bits, each bit corresponding to one switch.

A Benes network, which is also well know to those of ordinary skill in the art, is a network that receives z inputs and has $2\log_2(Z)-1$ stages of interconnected switches. Each stage has a number (z/2) of 2×2 crossbar switches, and the Benes network has a total number $z\log_2(Z)-(z/2)$ of 2×2 crossbar switches. Each switch, which receives two inputs and presents two outputs, can be set based on a bit value to (i) pass the two inputs directly to the two outputs in the order they were received (e.g., top input is provided to top output and bottom input is provided to bottom output) or (ii) swap the two inputs (e.g., such that the top input is provided to the bottom output, and vice versa). For z inputs, a Benes network is capable of performing $2^z$ different permutations, and each permutation coefficient $P_{j,k}$ is represented by $z\log_2(z)$ bits, where each bit corresponds to one switch.

For H-matrix 300, vector $\vec{x}$ may be represented as a set of sub-vectors, each sub-vector $\vec{x}_j$ having z elements, and each sub-vector corresponding to one block row of H-matrix 300 (i.e., j=1, . . . , 8), as shown in Equation (6):

$$\vec{x} = H_u\vec{u} = \begin{bmatrix}\vec{x}_1\\\vec{x}_2\\\vdots\\\vec{x}_8\end{bmatrix} \qquad (6)$$

Rather than multiplying the elements of user-data sub-matrix $H_u$ of H-matrix 300 by user-data vector $\vec{u}$, user-data vector $\vec{u}$ may be divided into sub-vectors $\vec{u}_k$, each user-data sub-vector $\vec{u}_k$ corresponding to one block column of the user-data sub-matrix $H_u$ of H-matrix 300 (i.e., 16) and each having z elements. Then, each sub-vector of vector $\vec{x}$ may be calculated by (i) permutating each of the sixteen user-data sub-vectors $\vec{u}_1, \ldots, \vec{u}_{16}$ according to the permutation coefficients $P_{j,k}$ in the corresponding block row of H-matrix 300, and (ii) adding the permutated user-data sub-vectors to one another. For example, the first sub-vector $\vec{x}_1$ may be computed by (i)

permutating user-data sub-vectors $\vec{u}_1, \ldots, \vec{u}_{16}$ by permutation coefficients $P_{j,k}$ of the first (i.e., top) row of H-matrix 300 as shown in Equation (7) below:

$$\vec{x}_1 = [\vec{u}_1]^3 + [\vec{u}_2]^0 + [\vec{u}_3]^{-1} + [\vec{u}_4]^{-1} + [\vec{u}_5]^2 + [\vec{u}_6]^0 +$$
$$[\vec{u}_7]^{-1} + [\vec{u}_8]^3 + [\vec{u}_9]^7 + [\vec{u}_{10}]^{-1} + [\vec{u}_{11}]^1 + [\vec{u}_{12}]^1 +$$
$$[\vec{u}_{13}]^{-1} + [\vec{u}_{14}]^{-1} + [\vec{u}_{15}]^{-1} + [\vec{u}_{16}]^{-1}, \quad (7)$$

where each superscripted-number represents a permutation coefficient $P_{j,k}$.

As shown, user-data sub-vectors $\vec{u}_1$ and $\vec{u}_8$ are each permutated by a factor of 3, user-data sub-vectors $\vec{u}_2$ and $\vec{u}_6$ are each permutated by a factor of 0 (i.e., is not permutated), user-data sub-vector $\vec{u}_5$ is permutated by a factor of 2, user-data sub-vector $\vec{u}_9$ is permutated by a factor of 7, and user-data sub-vectors 11 and 12 are each permutated by a factor of 1. Also, user-data sub-vectors $\vec{u}_3$, $\vec{u}_4$, $\vec{u}_7$, $\vec{u}_{10}$, $\vec{u}_{13}$, $\vec{u}_{14}$, $\vec{u}_{15}$, and $\vec{u}_{16}$ each have a permutation coefficient of −1, representing that the elements of these user-data sub-vectors are set to zero. Sub-vectors $\vec{x}_2, \ldots, \vec{x}_8$ may be generated in a similar manner based on the permutation coefficients $P_{j,k}$ of rows two through eight of user-data sub-matrix $H_u$ of H-matrix 300, respectively.

Figure 4:
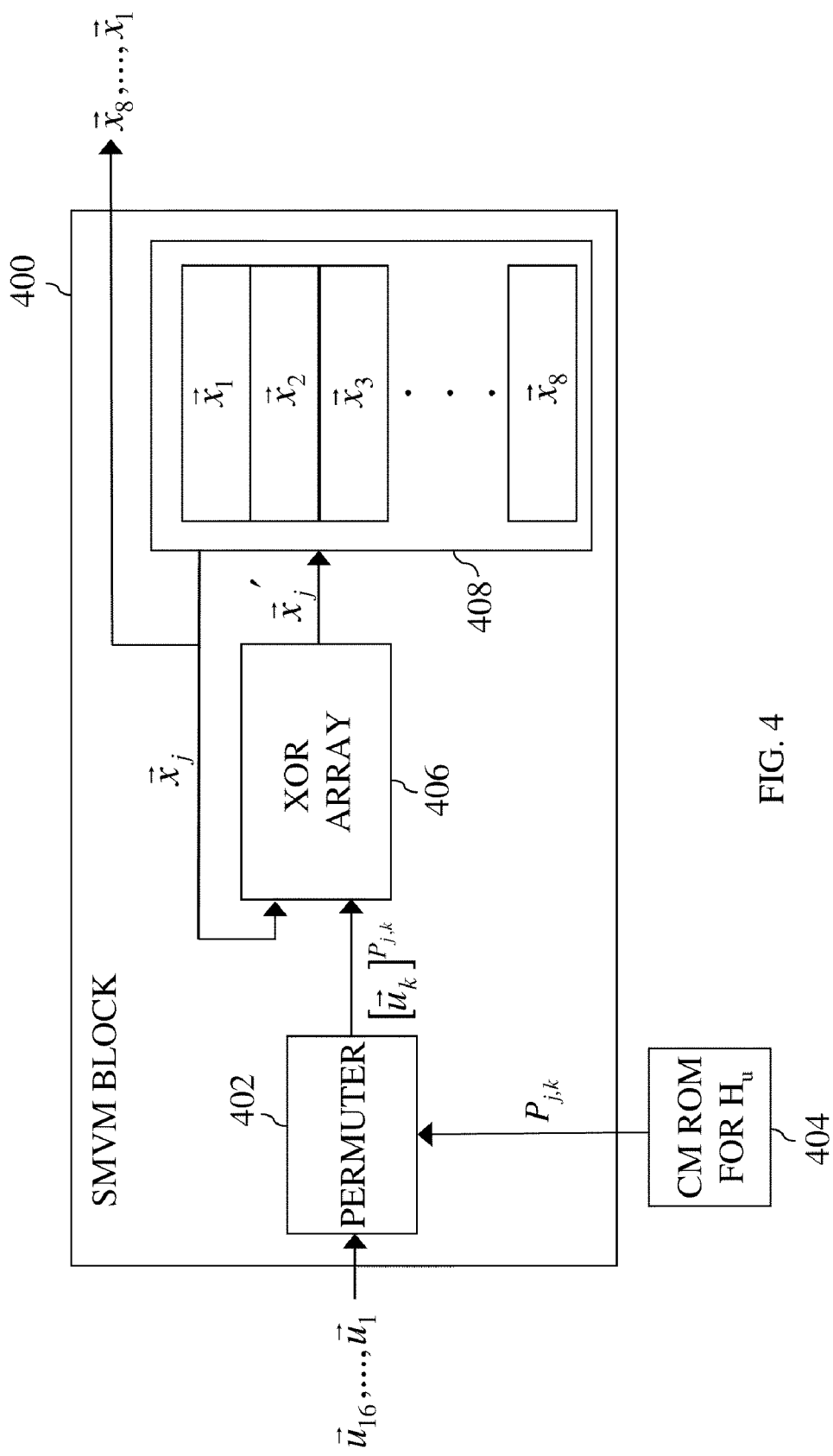
FIG. 4 shows a simplified block diagram of a sparse-matrix-vector (SMV) component according to one embodiment of the present invention.

FIG. 4 shows a simplified block diagram of a sparse-matrix-vector multiplication (SMVM) component 400 according to one embodiment of the present invention. To continue the example described above in relation to H-matrix 300 of FIG. 3, sparse-matrix-vector multiplication component 400 is shown as receiving sixteen user-data sub-vectors $\vec{u}_1, \ldots, \vec{u}_{16}$ and outputting eight sub-vectors $\vec{x}_1, \ldots, \vec{x}_8$. According to other embodiments, sparse-matrix-vector multiplication component 400 may be configured to operate with an H-matrix other than H-matrix 300 of FIG. 3, such that sparse-matrix-vector multiplication component 400 receives the same or a different number of user-data sub-vectors $\vec{u}_k$ and outputs the same or a different number of sub-vectors $\vec{x}_j$.

Rather than waiting for all sixteen user-data sub-vectors $\vec{u}_1, \ldots, \vec{u}_{16}$ to be received, sparse-matrix-vector multiplication (SMVM) component 400 updates the eight sub-vectors $\vec{x}_1, \ldots, \vec{x}_8$ as the user-data sub-vectors are received. For example, suppose that sparse-matrix-vector multiplication component 400 receives user-data sub-vector $\vec{u}_1$ corresponding to the first (i.e., left-most) block column of H-matrix 300. In the first block column of H-matrix 300, each of the permutation coefficients $P_{j,k}$ in the first, fifth, and seventh block rows correspond to either zero or a positive number. Sparse-matrix-vector multiplication component 400 updates vectors $\vec{x}_1$, $\vec{x}_5$, and $\vec{x}_7$, which correspond to the first, fifth, and seventh block rows, respectively, one at a time as described below. Further, each of the permutation coefficients $P_{j,k}$ in the second, third, fourth, sixth, and eighth block rows of first block column has a value of −1, indicating that each permutation coefficient $P_{j,k}$ corresponds to a block that is a zero matrix. Sub-vectors $\vec{x}_2$, $\vec{x}_3$, $\vec{x}_4$, $\vec{x}_6$, and $\vec{x}_8$ which correspond to the second, third, fourth, sixth, and eighth block rows, respectively, are updated; however, since each permutation coefficient $P_{j,k}$ has a value of −1, the value of each sub-vector $\vec{x}_2$, $\vec{x}_3$, $\vec{x}_4$, $\vec{x}_6$, and $\vec{x}_8$ is unchanged. Note that, the term "updating" as used herein in relation to the sub-vectors $\vec{x}_j$ refers to the processing of permutation coefficients $P_{j,k}$ that results in the sub-vectors $\vec{x}_j$ being changed, as well as the processing of permutation coefficients $P_{j,k}$ that results in the sub-vectors $\vec{x}_j$ being unchanged, such as by adding an all-zero vector to the sub-vectors $\vec{x}_j$ or by not adding anything to the sub-vectors $\vec{x}_j$ based on the permutation coefficients $P_{j,k}$ having a value of negative one.

Upon receiving user-data sub-vector $\vec{u}_1$, permuter 402 permutates user-data sub-vector $\vec{u}_1$ by a permutation coefficient $P_{j,k}$ of 3 (i.e., the permutation coefficient $P_{j,k}$ in the first block column and first block row of H-matrix 300), which is received from coefficient-matrix (CM) memory 404, which may be implemented, for example, as read-only memory (ROM). Permuter 402 may implement cyclic shifting, or permutations that are more random, such as those obtained using an Omega network or a Benes network described above, depending on the implementation of H-matrix 300. The permutated user-data sub-vector $[\vec{u}_1]^3$ is provided to XOR array 406, which comprises z XOR gates, such that each XOR gate receives a different one of the z elements of the permutated user-data sub-vector $[\vec{u}_1]^3$. Vector $\vec{x}_1$, which is initialized to zero, is also provided to XOR array 406, such that each XOR gate receives a different one of the z elements of vector $\vec{x}_1$. Each XOR gate of XOR array 406 performs exclusive disjunction (i.e., the XOR logic operation) on the permutated user-data sub-vector $[\vec{u}_1]^3$ element and vector $\vec{x}_1$ element that it receives, and XOR array 406 outputs updated vector $\vec{x}_1'$ to memory 408, where the updated vector $\vec{x}_1'$ is subsequently stored.

Next, permuter 402 permutates user-data sub-vector $\vec{u}_1$ by a permutation coefficient $P_{j,k}$ of 20 (i.e., the permutation coefficient $P_{j,k}$ in the first block column and the fifth block row of H-matrix 300), which is received from coefficient-matrix memory 404. The permutated user-data sub-vector $[\vec{u}_1]^{20}$ is provided to XOR array 406, such that each XOR gate receives a different one of the z elements of the permutated user-data sub-vector $[\vec{u}_1]^{20}$. Vector $\vec{x}_5$, which is initialized to zero, is also provided to XOR array 406, such that each XOR gate receives a different one of the z elements of vector $\vec{x}_5$. Each XOR gate of XOR array 406 performs exclusive disjunction on the permutated user-data sub-vector $[\vec{u}_1]^{20}$ element and vector $\vec{x}_5$ element that it receives, and XOR array 406 outputs updated vector $\vec{x}_5'$ to memory 408, where the updated vector $\vec{x}_5'$ is subsequently stored.

Next, permuter 402 permutates user-data sub-vector $\vec{u}_1$ by a permutation coefficient $P_{j,k}$ of 35 (i.e., the permutation coefficient $P_{j,k}$ in the first block column and the seventh block row of H-matrix 300), which is received from coefficient-matrix memory 404. The permutated user-data sub-vector r is provided to XOR array 406, such that each XOR gate receives a different one of the z elements of the permutated user-data sub-vector $[\vec{u}_1]^{35}$. Vector $\vec{x}_7$, which is initialized to zero, is also provided to XOR array 406, such that each XOR gate receives a different one of the z elements of vector $\vec{x}_7$. Each XOR gate of XOR array 406 performs exclusive disjunction on the permutated user-data sub-vector $[\vec{u}_1]^{35}$ element and vector $\vec{x}_7$ element that it receives, and XOR array 406 outputs updated vector $\vec{x}_7'$ to memory 408, where the updated vector $\vec{x}_7'$ is subsequently stored. This process is performed for user-data sub-vectors $\vec{u}_2, \ldots, \vec{u}_{16}$. Note, however, that the particular vectors $\vec{x}_j$ updated for each user-data sub-vector $\vec{u}_k$ may vary from one user-data sub-vector $\vec{u}_k$ to the next based on the location of positive- and zero-valued permutation coefficients $P_{j,k}$ in the user-data matrix $H_u$ of H-matrix 300. Once updating of sub-vectors $\vec{x}_1, \ldots, \vec{x}_8$ is complete, sub-vectors $\vec{x}_1, \ldots, \vec{x}_8$ are output to downstream processing.

Since the eight sub-vectors $\vec{x}_1, \ldots, \vec{x}_8$ are processed by permuter 402 as they are received, sparse-matrix-vector multiplication component 400 may be implemented such that none of sub-vectors $\vec{x}_1, \ldots, \vec{x}_8$ are buffered before being provided to permuter 402. Alternatively, sparse-matrix-vector multiplication component 400 may be implemented such that one or more of sub-vectors are provided to permuter 402 without being buffered. In these embodiments, permuter 402 may begin processing one or more of sub-vectors $\vec{x}_1, \ldots, \vec{x}_8$ before all eight sub-vectors $\vec{x}_1, \ldots, \vec{x}_8$ are received by sparse-matrix-vector multiplication component 400.

Other implementations of sparse-matrix-vector multiplication components are possible. For example, rather than updating the eight sub-vectors $\vec{x}_1, \ldots, \vec{x}_8$ as the user-data sub-vectors $\vec{u}_k$ are received, a sparse-matrix-vector multiplication component may comprise a buffer for storing all sixteen user-data sub-vectors $\vec{u}_1, \ldots, \vec{u}_{16}$ and may update the eight sub-vectors $\vec{x}_1, \ldots, \vec{x}_8$ either at the same time or one at a time. To update the eight sub-vectors $\vec{x}_1, \ldots, \vec{x}_8$ at the same time, the sparse-matrix-vector multiplication component may have eight XOR arrays that operate in parallel. A sparse-matrix-vector multiplication component that uses eight parallel XOR arrays may occupy a greater amount of chip area than sparse-matrix-vector multiplication component 400. To update the eight sub-vectors $\vec{x}_1, \ldots, \vec{x}_8$, one at a time, the sparse-matrix-vector multiplication component may have one XOR array that is used to sequentially update the eight sub-vectors $\vec{x}_1, \ldots, \vec{x}_8$ in a time-multiplexed manner. A sparse-matrix-vector multiplication component that updates the eight sub-vectors $\vec{x}_1, \ldots, \vec{x}_8$ in this manner may have a higher latency than sparse-matrix-vector multiplication component 400.

Calculating the Parity-Bit Vector

As described above in relation to Equation (5), parity-bit vector $\vec{p}$ may be generated by (i) generating vector $\vec{x}$, (ii) determining the inverse $[H_p]^{-1}$ of sub-matrix $H_p$, and (iii) multiplying vector $\vec{x}$ by $[H_p]^{-1}$. Vector $\vec{x}$ may be generated as described in relation to FIG. 4. Determining the inverse $[H_p]^{-1}$ of parity-bit sub-matrix $H_p$ may be performed using software. Once the inverse $[H_p]^{-1}$ of parity-bit sub-matrix $H_p$ is determined, it may be stored in memory. However, the inverse $[H_p]^{-1}$ of parity-bit sub-matrix $H_p$ typically will not be sparse, and as a result, a relatively large amount of memory is needed to store the inverse $[H_p]^{-1}$ of parity-bit sub-matrix $H_p$. Further, the step of multiplying the inverse $[H_p]^{-1}$ of parity-bit sub-matrix $H_p$ by vector $\vec{x}$ may be computationally intensive as a result of the inverse $[H_p]^{-1}$ of parity-bit sub-matrix $H_p$ not being sparse. To minimize the complexity and memory requirements of steps (ii) and (iii) above, the H-matrix may be arranged into blocks as shown in FIG. 5, and parity-bit vector $\vec{p}$ may be determined using a block-wise inversion.

Figure 5:
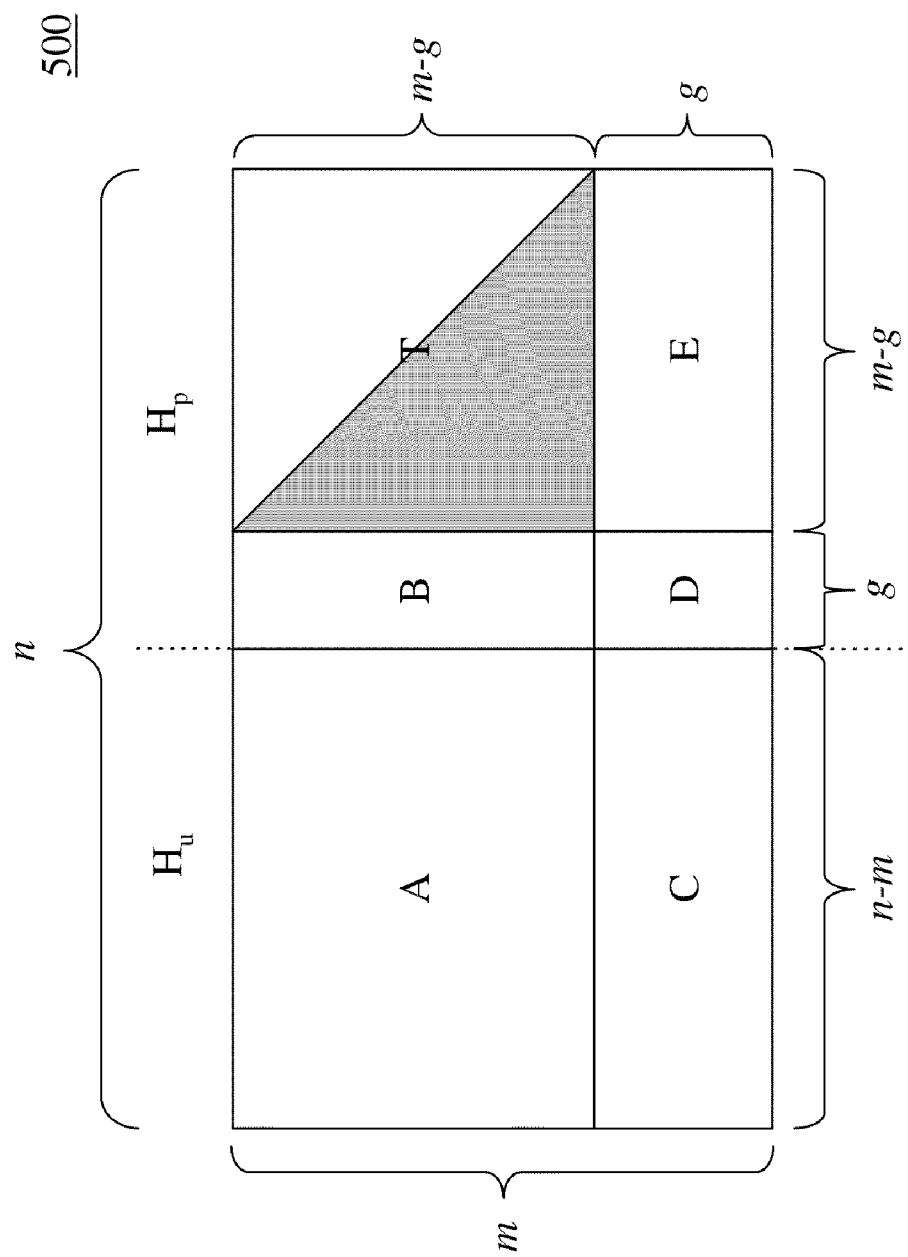
FIG. 5 shows a simplified representation of an H-matrix having a parity-bit sub-matrix in approximately lower triangular (ALT) form.

FIG. 5 shows a simplified representation of an H-matrix 500 having a parity-bit sub-matrix $H_p$ in approximately lower triangular (ALT) form. H-matrix 500 may be obtained by (1) performing pre-processing steps, such as row and column permutations, on an arbitrarily arranged H-matrix, or (2) designing the H-matrix to have the form of H-matrix 500. As shown, H-matrix 500 has an m×(n−m) user-data sub-matrix $H_u$ (to the left of the dashed line) and an m×m parity-bit sub-matrix $H_p$ (to the right of the line). The user-data sub-matrix $H_u$ is divided into an (m−g)×(n−m) sub-matrix A and a g×(n−m) sub-matrix C. The parity-bit sub-matrix $H_p$ is divided into an (m−g)×g sub-matrix B, a g×g sub-matrix D, an (m−g)×(m−g) sub-matrix T, and a g×(m−g) sub-matrix E. Sub-matrix T is arranged in lower triangular form where all elements of the sub-matrix positioned above the diagonal have a value of zero. H-matrix 500 is referred to as approximately lower triangular because lower triangular sub-matrix T is above sub-matrix E, which is not in lower triangular form.

Based on the structure of H-matrix 500, and by dividing parity-bit vector $\vec{p}$ into a first sub-vector $\vec{p}_1$ having length g and a second sub-vector $\vec{p}_2$ having length m−g, Equation (2) can be rewritten as shown in Equation (8):

$$H\vec{c} = [H_u \ H_p] \begin{bmatrix} \vec{u} \\ \vec{p} \end{bmatrix} = \begin{bmatrix} A & B & T \\ C & D & E \end{bmatrix} \begin{bmatrix} \vec{u} \\ \vec{p}_1 \\ \vec{p}_2 \end{bmatrix} = 0 \quad (8)$$

Multiplying Equation (8) by $$\begin{bmatrix} I & 0 \\ -ET^{-1} & I \end{bmatrix}$$

as shown in Equation (9) eliminates sub-matrix E from the lower right hand corner of parity-sub-matrix $H_p$ and results in Equation (10) below:

$$\begin{bmatrix} I & 0 \\ -ET^{-1} & I \end{bmatrix} \begin{bmatrix} A & B & T \\ C & D & E \end{bmatrix} \begin{bmatrix} \vec{u} \\ \vec{p}_1 \\ \vec{p}_2 \end{bmatrix} = 0 \quad (9)$$

$$\begin{bmatrix} A & B & T \\ -ET^{-1}A+C & -ET^{-1}B+D & 0 \end{bmatrix} \begin{bmatrix} \vec{u} \\ \vec{p}_1 \\ \vec{p}_2 \end{bmatrix} = 0 \quad (10)$$

Substituting $F=-ET^{-1}B+D$ into Equation (10) and solving for first and second parity-bit sub-vectors $\vec{p}_1$ and $\vec{p}_2$ results in Equations (11) and (12) below:

$$\vec{p}_1 = -F^{-1}(-ET^{-1}A\vec{u}+C\vec{u}) \quad (11)$$

$$\vec{p}_2 = -T^{-1}(A\vec{u} \pm B\vec{p}_1) \quad (12)$$

Figure 6:
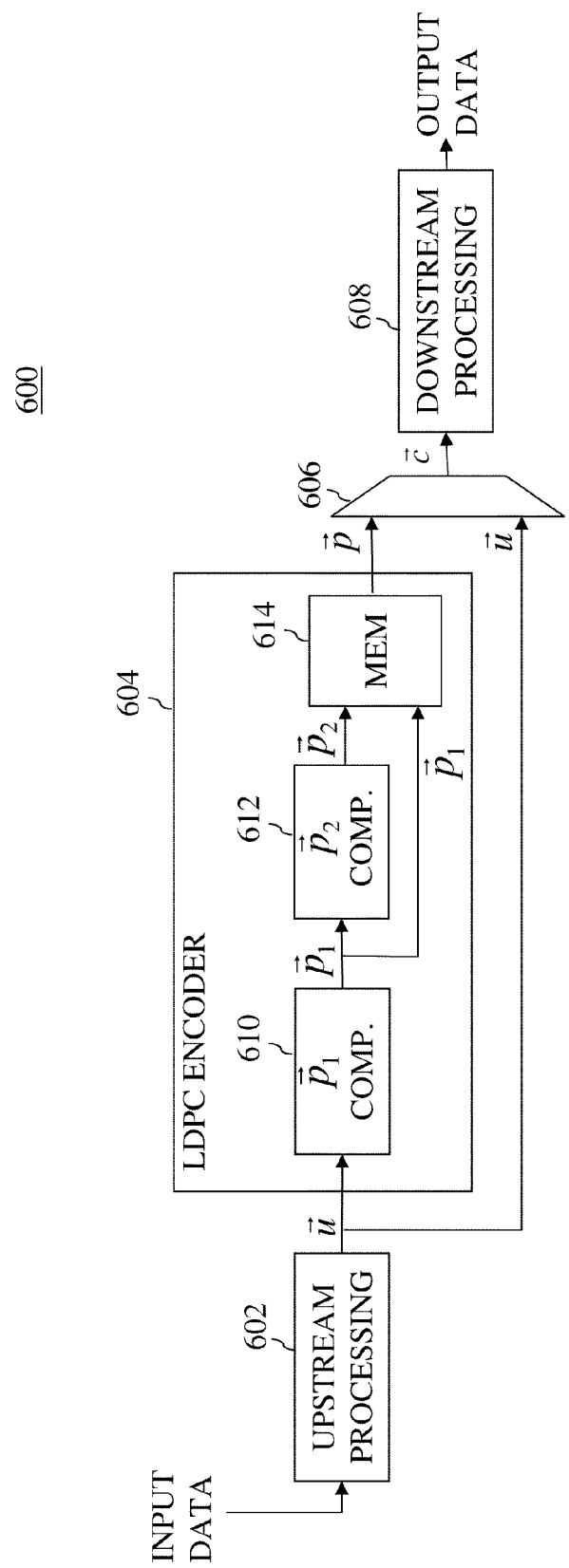
FIG. 6 shows a simplified block diagram of a signal processing device according to one embodiment of the present invention.

FIG. 6 shows a simplified block diagram of a signal processing device 600 according to one embodiment of the present invention. Signal processing device 600 upstream processing 602, multiplexer 606, and downstream processing 608, which may perform processing similar to that of the analogous components of signal processing device 200 of FIG. 2. Further, signal processing device 600 has LDPC encoder 604, which generates parity-bit vector $\vec{p}$ based on Equations (11) and (12) above. In particular, LDPC encoder 604 has first parity-bit sub-vector component 610, which receives user data vector $\vec{u}$ and generates a first parity-bit sub-vector $\vec{p}_1$ using Equation (11). First parity parity-bit sub-vector $\vec{p}_1$ is (i) provided to second parity-bit sub-vector component 612 and (ii) memory 614. Second parity-bit sub-vector component 612 generates a second parity-bit sub-vector $\vec{p}_2$ using Equation (12) and provides the second parity-bit sub-vector $\vec{p}_2$ to memory 614. Memory 614 then outputs parity-bit vector $\vec{p}$, by appending second parity-bit sub-vector $\vec{p}_2$ onto the end of first parity-bit sub-vector $\vec{p}_1$.

Figure 7:
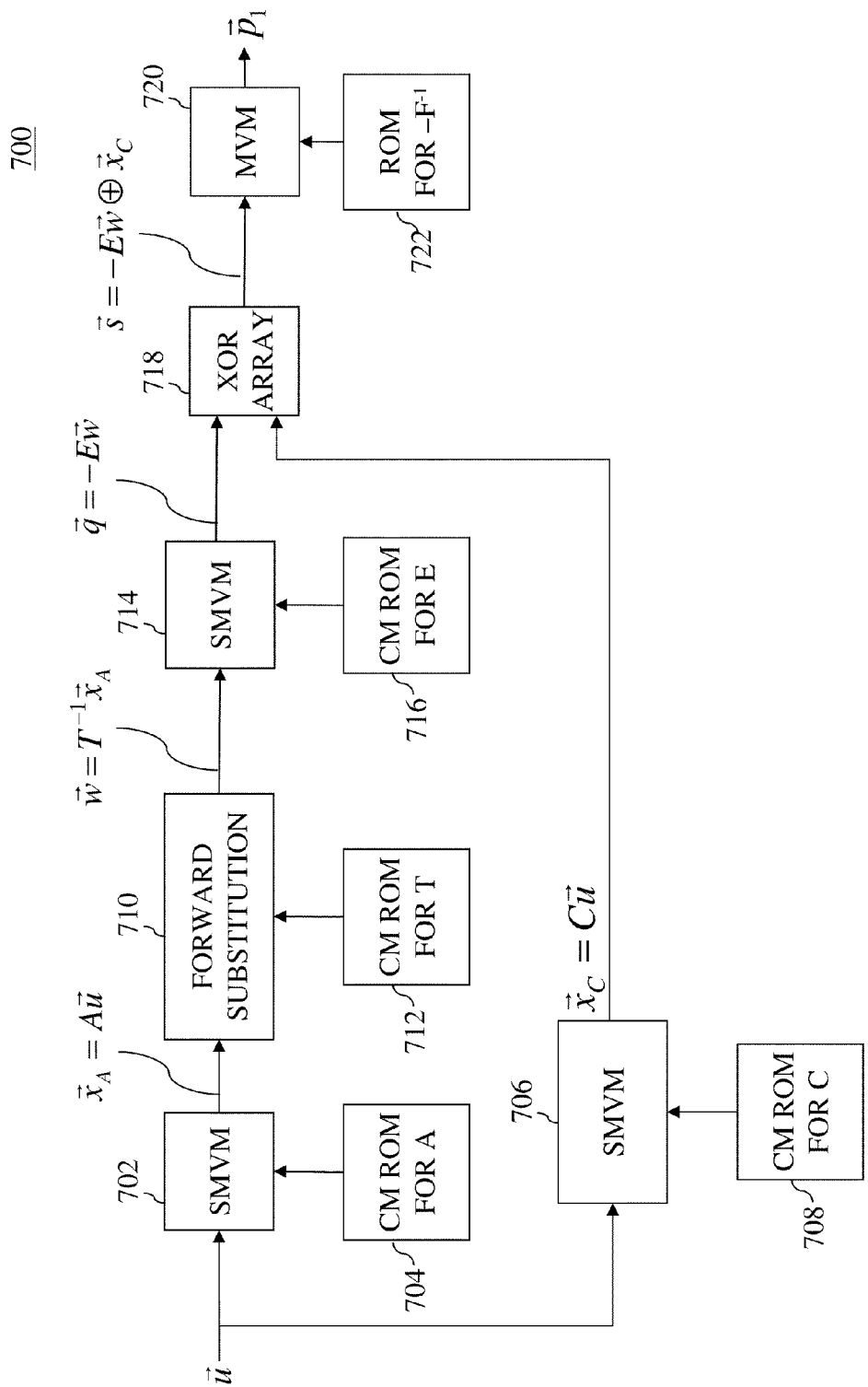
FIG. 7 shows a simplified block diagram of a first parity-bit sub-vector component according to one embodiment of the present invention that may be used to implement the first parity-bit sub-vector component in FIG. 6.

FIG. 7 shows a simplified block diagram of a first parity-bit sub-vector component 700 according to one embodiment of the present invention that may be used to implement first parity-bit sub-vector component 610 in FIG. 6. Parity-bit vector component 700 receives user-data vector 17 from, for example, upstream processing such as upstream processing 602 of FIG. 6, and generates first parity-bit sub-vector $\vec{p}_1$ shown in Equation (11). User-data vector $\vec{u}$ is provided to sparse-matrix-vector multiplication (SMVM) components 702 and 706, each of which may be implemented in a manner similar to that of sparse-matrix-vector multiplication component 400 of FIG. 4 or in an alternative manner such as those described above in relation to sparse-matrix-vector multiplication component 400. Note, however, that unlike sparse-matrix-vector multiplication component 400 which calculates the entire vector $\vec{x}$ by multiplying the entire user-data sub-matrix $H_u$ by the user-data vector $\vec{u}$ as shown in Equation (6), sparse-matrix-vector multiplication components 702 and 706 each generate a sub-vector of vector $\vec{x}$. In particular, sparse-matrix-vector multiplication component 702 receives permutation coefficients corresponding to sub-matrix A of H-matrix 500 of FIG. 5 from coefficient-matrix memory 704, which may be implemented as ROM, and generates sub-vector $\vec{x}_A$ shown in Equation (13) below:

$$\vec{x}_A = A\vec{u} \qquad (13)$$

Sub-vector $\vec{x}_A$ is then provided to forward substitution component 710. Sparse-matrix-vector multiplication component 706 receives permutation coefficients corresponding to sub-matrix C of H-matrix 500 from coefficient-matrix memory 712, which may also be implemented as ROM, and generates sub-vector $\vec{x}_C$ shown in Equation (14) below:

$$\vec{x}_C = C\vec{u} \qquad (14)$$

Sub-vector $\vec{x}_C$ is then provided to XOR array 718, which is discussed further below.

Figure 8:
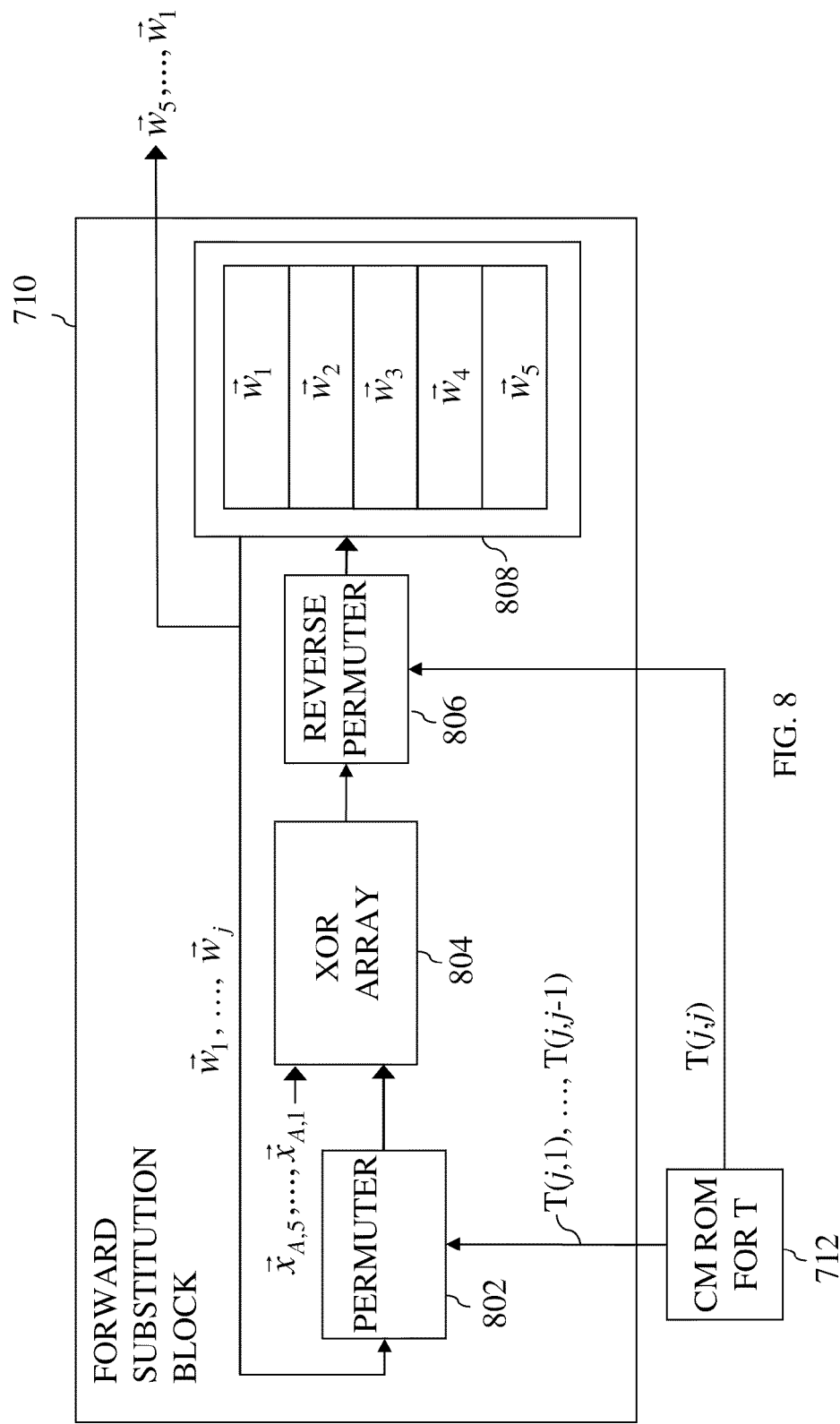
FIG. 8 shows a simplified block diagram of a forward substitution component according to one embodiment of the present invention.

FIG. 8 shows a simplified block diagram of forward substitution component 710 of FIG. 7 according to one embodiment of the present invention. In general, forward substitution component 710 uses a forward substitution technique to generate vector $\vec{w}$ shown in Equation (15) below:

$$\vec{w} = T^{-1}\vec{x}_A = T^{-1}A\vec{u} \qquad (15)$$

To further understand the forward substitution technique, consider the exemplary sub-matrix T, vector $\vec{x}_A$, and vector $\vec{w}$, which are substituted into Equation (15) as shown in Equation (16) below:

$$\vec{w} = \begin{bmatrix} T(1,1) & -1 & -1 & -1 & -1 \\ T(2,1) & T(2,2) & -1 & -1 & -1 \\ T(3,1) & T(3,2) & T(3,3) & -1 & -1 \\ T(4,1) & T(4,2) & T(4,3) & T(4,4) & -1 \\ T(5,1) & T(5,2) & T(5,3) & T(5,4) & T(5,5) \end{bmatrix}^{-1} \begin{bmatrix} \vec{x}_{A,1} \\ \vec{x}_{A,2} \\ \vec{x}_{A,3} \\ \vec{x}_{A,4} \\ \vec{x}_{A,5} \end{bmatrix} = \begin{bmatrix} \vec{w}_1 \\ \vec{w}_2 \\ \vec{w}_3 \\ \vec{w}_4 \\ \vec{w}_5 \end{bmatrix} \qquad (16)$$

Sub-matrix T, which is lower triangular, has five block columns and five block rows, and is in coefficient-matrix format, where (i) each element T(j,k) is a permutation coefficient of a z×z weight one matrix and (ii) each negative element (i.e., −1) corresponds to a z×z zero matrix. Each weight one matrix may be permutated using, for example, cyclic shifting or permutations that are more random, such as those obtained using an Omega network or a Benes network. In the case of cyclic shifting, cyclic shifting of the weight one matrices may be selected by the designer of the coefficient matrix to be right, left, up, or down cyclic shifting. As shown in Equation (16), using a non-forward substitution method, the elements of the inverse $T^{-1}$ of sub-matrix T (i.e., all z×z×25 matrix values; not the 25 permutation coefficients) may be multiplied by vector $\vec{x}_A$, which has five sub-vectors $\vec{x}_{A,j}$, each comprising z elements and j=0, . . . , 5, to generate vector $\vec{w}$, which has five sub-vectors $\vec{w}_j$, each comprising z elements and j=0, . . . , 5. However, this computation may be computationally intensive and involves the storing of all of the elements of sub-matrix T. To reduce computational complexity, a forward substitution technique may be used as described below. Further, to reduce memory requirements, the forward substitution technique may be combined with a permutation scheme that allows for the storing of only the 25 permutation coefficients, rather than all z×z×25 elements of sub-matrix T.

Forward substitution is performed by computing sub-vector $\vec{w}_1$, then substituting sub-vector $\vec{w}_1$ forward into the next equation to solve for sub-vector $\vec{w}_2$, substituting sub-vectors $\vec{w}_1$ and $\vec{w}_2$ forward into the next equation to solve for sub-vector $\vec{w}_3$, and so forth. Using this forward substitution technique, each sub-vector $\vec{w}_j$ may be generated as follows in Equation (17):

$$\vec{w}_j = \left[ \vec{x}_{A,j} \oplus \sum_{k=0}^{j-1} [\vec{w}_k]^{T(j,k)} \right]^{-T(j,j)}, \qquad (17)$$

where the symbol ⊕ indicates an XOR operation.

By using forward substitution, the inverse $T^{-1}$ sub-matrix T does not need to be computed. Further, as shown in Equation (17), rather than multiplying sub-vectors $\vec{x}_{A,j}$ by the elements of the inverse $T^{-1}$ of sub-matrix T to generate $\vec{w}_j$, each sub-vector of vector $\vec{w}_j$ may be calculated by permutating sub-vectors $\vec{w}_j$ according to the permutation coefficients of sub-matrix T. For example, based on Equation (17) and the permutation coefficients of exemplary sub-matrix T of Equation (16), sub-vectors $\vec{w}_1, \ldots, \vec{w}_5$ may be represented by Equations (18) through (22):

$$\vec{w}_1 = \vec{x}_{A,1}{}^{-T(1,1)} \qquad (18)$$

$$\vec{w}_2 = [\vec{x}_{A,2} \oplus \vec{w}_1{}^{T(2,1)}]^{-T(2,2)} \qquad (19)$$

$$\vec{w}_3 = [\vec{x}_{A,3} \oplus [\vec{w}_1^{T(3,1)} + \vec{w}_2^{T(3,2)}]]^{-T(3,3)} \quad (20)$$

$$\vec{w}_4 = [\vec{x}_{A,4} \oplus [\vec{w}_1^{T(4,1)} + \vec{w}_2^{T(4,2)} + \vec{w}_3^{T(4,3)}]]^{-T(4,4)} \quad (21)$$

$$\vec{w}_5 = [\vec{x}_{A,5} \oplus [\vec{w}_1^{T(5,1)} + \vec{w}_2^{T(5,2)} + \vec{w}_3^{T(5,3)} + \vec{w}_4^{T(5,4)}]]^{-T(5,5)} \quad (22)$$

Returning to FIG. 8 and continuing the example above, forward substitution component 710 is shown as receiving five sub-vectors $\vec{x}_{A,1}, \ldots, \vec{x}_{A,5}$ and outputting five sub-vectors $\vec{w}_1, \ldots, \vec{w}_5$. According to other embodiments, forward substitution component 710 may be configured to operate with a sub-matrix T other than the sub-matrix T illustrated in Equation (16), such that forward substitution component 710 receives the same or a different number of sub-vectors $\vec{x}_{A,j}$, and outputs the same or a different number of sub-vectors $\vec{w}_j$.

Initially, upon receiving sub-vector $\vec{x}_{A,1}$, XOR array 804 provides sub-vector $\vec{x}_{A,1}$ to reverse permuter 806. XOR array 804 may output sub-vector $\vec{x}_{A,1}$ without performing any processing or XOR array 804 may apply exclusive disjunction to (i) sub-vector $\vec{x}_{A,1}$ and (ii) an initialized vector having a value of zero, resulting in no change to sub-vector $\vec{x}_{A,1}$. Sub-vector $\vec{x}_{A,1}$ is then permutated according to the negative of permutation coefficient T(1,1) received from coefficient-matrix memory 712 as shown in Equation (18). Note that, similar to permuter 402 of FIG. 4, permuter 802 and reverse permuter 806 may implement cyclic shifting, or permutations that are more random, such as those obtained using an Omega network or a Benes network described above, depending on the implementation of sub-matrix T in Equation (16). In the case of cyclic shifting, to obtain negative shifts (i.e., −T(1,1)), reverse permuter 806 performs cyclic shifting in the opposite direction of permuter 802. For example, if permuter 802 performs right cyclic shifting, then reverse permuter 806 performs left cyclic shifting. The permutated sub-vector $\vec{x}_{A,1}$ is then stored in coefficient-matrix memory 808 as sub-vector $\vec{w}_1$.

To generate sub-vector $\vec{w}_2$, memory 808 provides sub-vector $\vec{w}_1$ to permuter 802, which permutates sub-vector $\vec{w}_1$ by permutation coefficient T(2,1) received from coefficient-matrix memory 712 as shown in Equation (19). XOR array 804 applies exclusive disjunction to (i) sub-vector $\vec{x}_{A,2}$ and (ii) the permutated sub-vector $\vec{w}_1^{T(2,1)}$, and the output of XOR array 804 is permutated by the negative of permutation coefficient T(2,2) received from coefficient-matrix memory 712 as shown in Equation (19). The output of reverse permuter 806 is then stored in memory 808 as sub-vector $\vec{w}_2$. To generate sub-vector $\vec{w}_3$, memory 808 provides sub-vectors $\vec{w}_1$ and $\vec{w}_2$ to permuter 802, which permutates the vectors by permutation coefficients T(3,1) and T(3,2), respectively as shown in Equation (20). XOR array 804 applies exclusive disjunction to (i) permuted sub-vector $\vec{w}_{T(3,1)}$, (ii) permuted sub-vector $\vec{w}_2^{T(3,2)}$, and (iii) sub-vector $\vec{x}_{A,3}$. The output of XOR array 804 is permutated by the negative of permutation coefficient T(3,3) received from coefficient-matrix memory 712 as shown in Equation (20). The output of reverse permuter 806 is then stored in memory 808 as sub-vector $\vec{w}_3$. This process is continued using sub-vectors $\vec{w}_1$, $\vec{w}_2$, and $\vec{w}_3$ to generate sub-vector $\vec{w}_4$ and using sub-vectors $\vec{w}_1$, $\vec{w}_2$, $\vec{w}_3$, and $\vec{w}_4$ to generate sub-vector $\vec{w}_5$.

Note that, according to various embodiments, the present invention may also be applied to backward substitution for upper-triangular matrices. In such embodiments, rather than solving equations (i.e., rows) at the top of the matrix and substituting the results into rows below (i.e., forward substitution), such embodiments may solve the equations at the bottom and substitute the results into rows above (i.e., backward substitution). For example, suppose that FIG. 8 is used for backward substitution. Sub-vectors $\vec{w}_1, \ldots, \vec{w}_5$ may be determined beginning with sub-vector $\vec{w}_5$ and ending with sub-vector $\vec{w}_1$. Sub-vector $\vec{w}_5$ may be determined based on (i) permutation coefficients from the fifth row of an upper-triangular sub-matrix T (not shown) and (ii) fifth input sub-vector $\vec{x}_{A,5}$. Sub-vector $\vec{w}_4$ may be determined based on (i) permutation coefficients from the fourth row of an upper-triangular sub-matrix T, (ii) sub-vector $\vec{w}_5$, and (iii) fourt input sub-vector $\vec{x}_{A,4}$, and so forth.

Returning to FIG. 7, forward substitution component 710 outputs vector $\vec{w}$, comprising sub-vectors $\vec{w}_1, \ldots, \vec{w}_5$ to sparse-matrix-vector multiplication component 714. Sparse-matrix-vector multiplication component 714 receives permutation coefficients corresponding to sub-matrix E of H-matrix 500 of FIG. 5 from memory 716, which may be implemented as ROM, and generates vector $\vec{q}$ as shown in Equation (23) below:

$$\vec{q} = -E\vec{w} = -ET^{-1}\vec{x}_A = -ET^{-1}A\vec{u} \quad (23)$$

Sparse-matrix-vector multiplication component 714 may be implemented in a manner similar to that described above in relation to sparse-matrix-vector multiplication component 400 of FIG. 4 or in an alternative manner such as those described above in relation to sparse-matrix-vector multiplication component 400. However, rather than receiving that user-data vector $\vec{u}$ and generating vector $\vec{x}$ like sparse-matrix-vector multiplication component 400, sparse-matrix-vector multiplication component 714 receives vector $\vec{w}$ and generates vector $\vec{q}$.

Vector $\vec{q}$ is provided to XOR array 718 along with vector $\vec{x}_C$, and XOR array 718 performs exclusive disjunction on vectors $\vec{q}$ and $\vec{x}_C$ to generate vector $\vec{s}$ as shown in Equation (24) below:

$$\vec{s} = -E\vec{w} + \vec{x}_C = -ET^{-1}\vec{x}_A + \vec{x}_C = -ET^{-1}A\vec{u} + C\vec{u} \quad (24)$$

Vectors $\vec{s}$ then output to matrix-vector multiplication (MVM) component 720. Matrix-vector multiplication (MVM) component 720 receives elements of matrix $-F^{-1}$ and performs matrix-vector multiplication to generate first parity-bit sub-vector $\vec{p}_1$ shown in Equation (25):

$$\vec{p}_1 = -F^{-1}\vec{s} = -F^{-1}(-ET^{-1}A\vec{u} + C\vec{u}) \quad (25)$$

The elements of sub-matrix $-F^{-1}$ may be pre-computed and stored in memory 722, which may be implemented as ROM. Note that, unlike coefficient-matrix memories 704, 708, 712, and 716, which store only permutation coefficients, memory 716 stores all of the elements of sub-matrix $-F^{-1}$.

Figure 9:
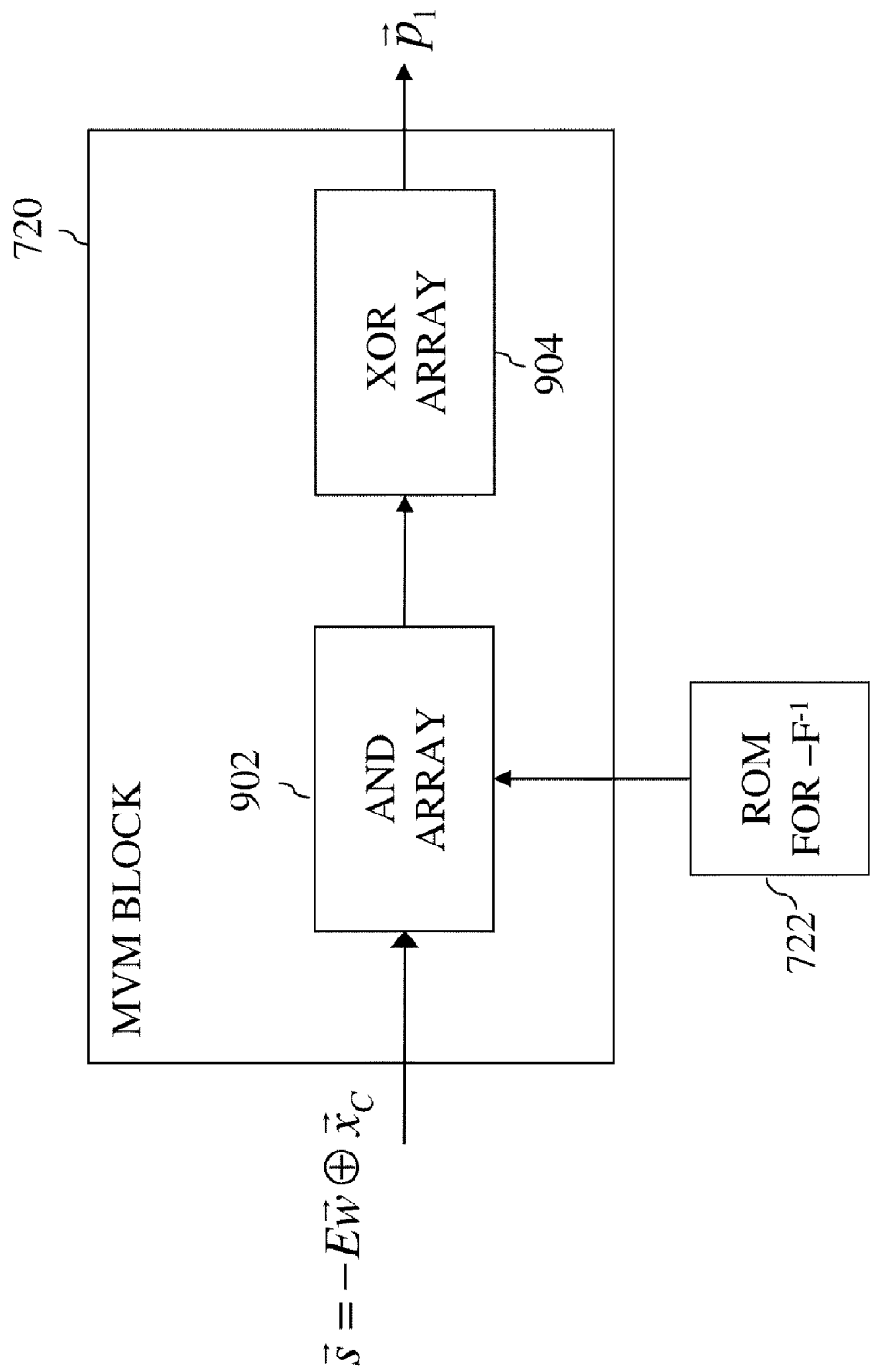
FIG. 9 shows a simplified block diagram of a matrix-vector multiplication component according to one embodiment of the present invention.

FIG. 9 shows a simplified block diagram of matrix-vector multiplication component 720 according to one embodiment of the present invention. Matrix-vector multiplication component 720 has AND gate array 902 which applies logical conjunction (i.e., AND logic operation) to (i) vector $-\vec{s}$, received from, for example, XOR array 718 of FIG. 7, and (ii) the elements of matrix $-F^{-1}$, received from memory 722. The outputs of AND gate array 902 are then applied to XOR array 904, which performs exclusive disjunction on the outputs to generate the elements of first parity-bit sub-vector $\vec{p}_1$.

To further understand the operations of matrix-vector multiplication component 720, consider the following simplified example. Suppose that matrix $-F^{-1}$ and vector $\vec{s}$ have the values shown in Equations (26) and (27), respectively, below:

$$-F^{-1} = \begin{bmatrix} 1 & 0 & 0 \\ 0 & 0 & 1 \end{bmatrix} \quad (26)$$

$$\vec{s} = \begin{bmatrix} 1 \\ 0 \\ 0 \end{bmatrix} \quad (27)$$

The resulting parity-bit sub-vector $\vec{p}_1$ has two elements $p_1[1]$ and $p_1[2]$ (i.e., $\vec{p}_1 = [p_1[1]\ p_1[2]]$) that are obtained as follows in Equations (28) and (29), respectively:

$$p_1[1] = (1\,AND\,1)\,XOR\,(0\,AND\,0)\,XOR\,(0\,AND\,0) = 1 \quad (28)$$

$$p_1[2] = (0\,AND\,1)\,XOR\,(0\,AND\,0)\,XOR\,(1\,AND\,0) = 0 \quad (29)$$

Thus, according to this simplified example, parity-bit sub-vector $\vec{p}_1 = [1, 0]$.

Figure 10:
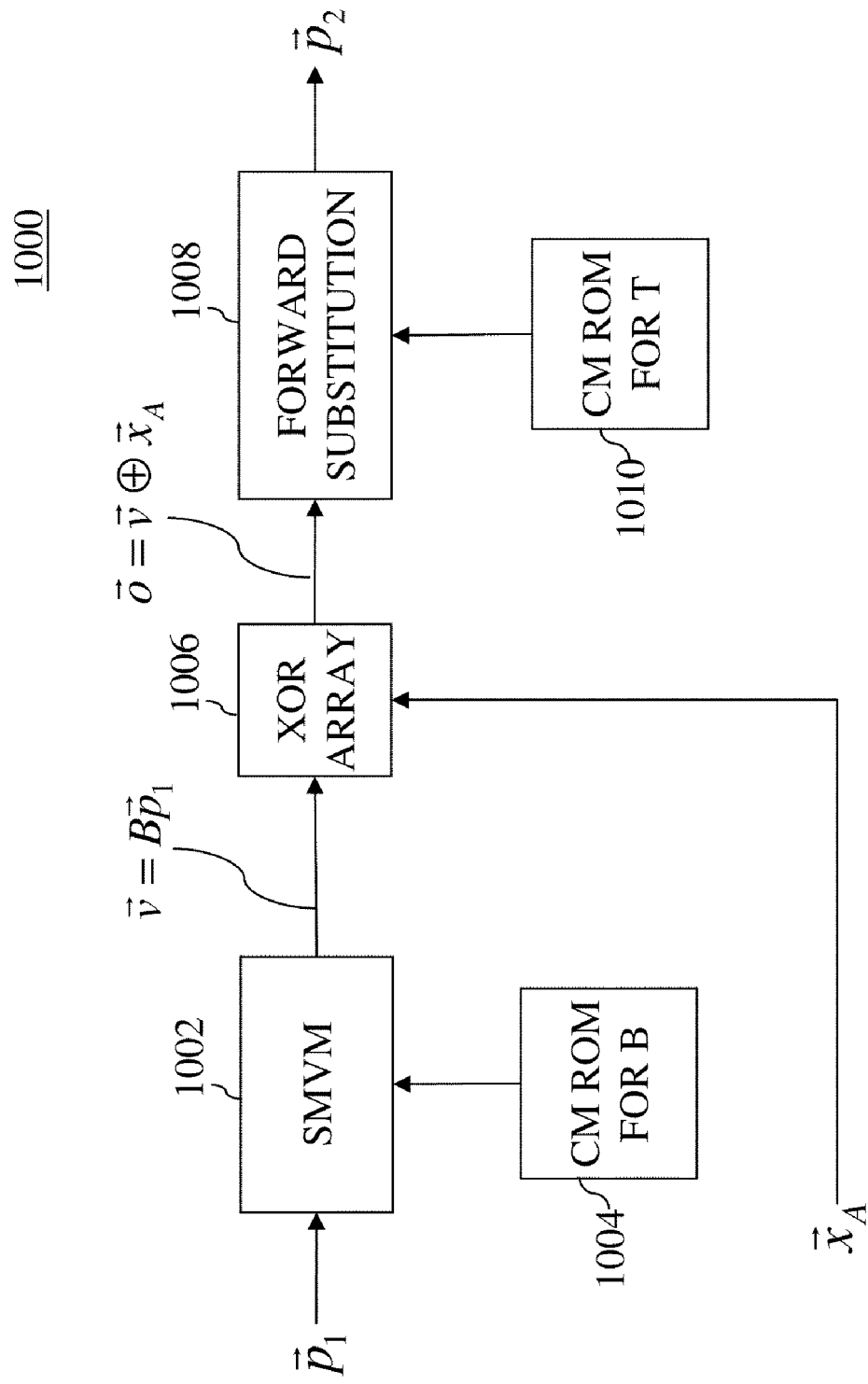
FIG. 10 shows a simplified block diagram of a second parity-bit sub-vector component according to one embodiment of the present invention that may be used to implement the second parity-bit sub-vector component in FIG. 6.

FIG. 10 shows a simplified block diagram of a second parity-bit sub-vector component 1000 according to one embodiment of the present invention that may be used to implement second parity-bit sub-vector component 612 in FIG. 6. Parity-bit sub-vector component 1000 receives (i) first parity-bit sub-vector $\vec{p}_1$ from, for example, parity-bit vector component 700 of FIG. 7, and (ii) sub-vector $\vec{x}_A$, and generates second parity-bit sub-vector $\vec{p}_2$ shown in Equation (12). Sub-vector $\vec{x}_A$ may be received from, for example, sparse-matrix-vector multiplication (SMVM) component 702 in FIG. 7, or second parity-bit sub-vector component 1000 may generate sub-vector $\vec{x}_A$ using its own sparse-matrix-vector multiplication component (not shown) that is similar to sparse-matrix-vector multiplication (SMVM) component 702.

First parity-bit sub-vector $\vec{p}_1$ is processed by sparse-matrix-vector multiplication (SMVM) component 1002, which may be implemented in a manner similar to that of sparse-matrix-vector multiplication component 400 of FIG. 4 or in an alternative manner such as those described above in relation to sparse-matrix-vector multiplication component 400. In so doing, sparse-matrix-vector multiplication component 1002 receives permutation coefficients corresponding to sub-matrix B of H-matrix 500 of FIG. 5 from memory 1004, which may be implemented as ROM, and generates vector $\vec{v}$ shown in Equation (30) below:

$$\vec{v} = B\vec{p}_1 \quad (30)$$

Vector $\vec{v}$ is provided to XOR array 1006 along with vector $\vec{x}_A$, and XOR array 1006 performs exclusive disjunction on vectors $\vec{v}$ and $\vec{x}_A$ to generate vector $\vec{o}$ as shown in Equation (31):

$$\vec{o} = \vec{v} \oplus \vec{x}_A = A\vec{u} + B\vec{p}_1 \quad (31)$$

Forward substitution component 1008 receives (i) permutation coefficients corresponding to sub-matrix T of H-matrix 500 of FIG. 5 from memory 1010, which may be implemented as ROM, and (ii) vector $\vec{o}$, and generates second parity-sub-vector vector $\vec{p}_2$ shown in Equation (32) below:

$$\vec{p}_2 = -T^{-1}\vec{o} = -T^{-1}(A\vec{u} + B\vec{p}_1) \quad (32)$$

Forward substitution component 1008 may be implemented in a manner similar to forward substitution component 710 of FIG. 8, albeit, receiving vector 5 rather than vector $\vec{x}_A$, and outputting second parity-sub-vector vector $\vec{p}_2$ rather than vector $\vec{w}$.

Although the present invention was described relative to exemplary H-matrices (e.g., 100, 300), the present invention is not so limited. The present invention may be implemented for various H-matrices that are the same size as or a different size from these exemplary matrices. For example, the present invention may be implemented for H-matrices in which the numbers of columns, block columns, rows, block rows, and messages processed per clock cycle, the sizes of the sub-matrices, the sizes of the column and/or row hamming weights differ from that of H-matrices 100 and 300. Such H-matrices may be, for example, cyclic, non-cyclic, quasi-cyclic, non-cyclic, regular, or irregular H-matrices.

It will be further understood that various changes in the details, materials, and arrangements of the parts which have been described and illustrated in order to explain the nature of this invention may be made by those skilled in the art without departing from the scope of the invention as expressed in the following claims.

Although embodiments of the present invention have been described in the context of LDPC codes, the present invention is not so limited. Embodiments of the present invention could be implemented for any code, including error-correction codes, that can be defined by a graph, e.g., tornado codes and structured IRA codes, since graph-defined codes suffer from trapping sets.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. An apparatus comprising a substitution component that performs substitution based on a triangular matrix and an input vector to generate an output vector, the apparatus comprising:
   memory that stores output sub-vectors of the output vector;
   a first permuter that permutates one or more previously generated output sub-vectors of the output vector based on one or more corresponding permutation coefficients to generate one or more permuted sub-vectors, wherein each permutation coefficient corresponds to a different sub-matrix in a current block row of the triangular matrix;
   an XOR gate array that performs exclusive disjunction on (i) the one or more permuted sub-vectors and (ii) a current input sub-vector of the input vector to generate an intermediate sub-vector;
   a second permuter that permutates the intermediate sub-vector based on a permutation coefficient corresponding to another sub-matrix in the current block row to generate a current output sub-vector of the output vector.

2. The apparatus of claim 1, wherein:
   the substitution component is a forward substitution component; and
   the triangular matrix is a lower-triangular matrix.

3. The apparatus of claim 2, wherein each output sub-vector of the output vector is proportional to $$\left[\vec{x}_j \oplus \sum_{k=0}^{j-1} [\vec{w}_k]^{T(j,k)}\right]^{-T(j,j)},$$

where:
   $\vec{x}_j$ is the current input sub-vector of the input vector;
   $\vec{w}_k$ is a previously generated output sub-vector of the output vector;
   $T(j,k)$ is a permutation coefficient corresponding to the $j^{th}$ row and $k^{th}$ column of the lower-triangular matrix;
   $T(j,j)$ is a permutation coefficient corresponding to the $j^{th}$ row and $j^{th}$ column of the lower-triangular matrix; and
   each permutation coefficient indicates an amount of reordering applied to a corresponding sub-vector.

4. The apparatus of claim 1, wherein the apparatus is an error-correction encoder that receives a user-data vector and generates a parity-bit vector based on a parity-check matrix H that is arranged in approximately lower-triangular form.

5. The apparatus of claim 4, wherein:
   the parity-check matrix H is given by:

$$H = \begin{bmatrix} A & B & T \\ C & D & E \end{bmatrix}$$

where A, B, C, D, and E are sub-matrices of the parity-check matrix H;
   T is the triangular matrix;
   the input vector is generated by a first matrix-vector multiplication (MVM) component operating based on (i) sub-matrix A and (ii) the user-data vector; and
   the output vector is applied to a second MVM component operating based on sub-matrix E.

6. The apparatus of claim 4, wherein the encoder is a low-density parity-check (LDPC) encoder.

7. The apparatus of claim 1, wherein each permutation coefficient corresponds to one of:
   (i) reordering vector elements of a corresponding sub-vector;
   (ii) leaving the corresponding sub-vector unchanged; and
   (iii) replacing the corresponding sub-vector with a zero sub-vector.

8. The apparatus of claim 7, wherein:
   the first and second permuters are cyclic shifters; and
   each cyclic shifter reorders the vector elements of a corresponding sub-vector by cyclically shifting the vector elements by a specified number of vector elements.

9. The apparatus of claim 7, wherein:
   the first and second permuters are implemented based on an Omega network; and
   each Omega network reorders the vector elements of a corresponding sub-vector based on a corresponding permutation coefficient.

10. The apparatus of claim 7, wherein:
    the first and second permuters are implemented based on a Benes network; and
    each Benes network reorders the vector elements of a corresponding sub-vector based on a corresponding permutation coefficient.

11. An encoder-implemented method for performing substitution based on a triangular matrix and an input vector to generate an output vector, the method comprising:
    (a) the encoder storing in memory output sub-vectors of the output vector;
    (b) the encoder permuting one or more previously generated output sub-vectors of the output vector based on one or more corresponding permutation coefficients to generate one or more permuted sub-vectors, wherein each permutation coefficient corresponds to a different sub-matrix in a current block row of the triangular matrix;

(c) the encoder performing exclusive disjunction on (i) the one or more permuted sub-vectors and (ii) a current input sub-vector of the input vector to generate an intermediate sub-vector;

(d) the encoder permuting the intermediate sub-vector based on a permutation coefficient corresponding to another sub-matrix in the current block row to generate a current output sub-vector of the output vector.

12. The encoder-implemented method of claim 11, wherein:
the substitution is forward substitution;
the encoder implemented method is for performing forward substitution; and
the triangular matrix is a lower-triangular matrix.

13. The encoder-implemented method of claim 12, wherein each output sub-vector of the output vector is proportional to $$\left[\vec{x}_j \oplus \sum_{k=0}^{j-1} [\vec{w}_k]^{T(j,k)}\right]^{-T(j,j)},$$

where:
$\vec{x}_j$ is the current input sub-vector of the input vector;
$\vec{w}_k$ is a previously generated output sub-vector of the output vector;
$T(j,k)$ is a permutation coefficient corresponding to the $j^{th}$ row and $k^{th}$ column of the lower-triangular matrix;
$T(j,j)$ is a permutation coefficient corresponding to the $j^{th}$ row and $j^{th}$ column of the lower-triangular matrix; and
each permutation coefficient indicates an amount of reordering applied to a corresponding sub-vector.

14. The encoder-implemented method of claim 11, wherein the encoder-implemented method is an error-correction encoder-implemented method that receives a user-data vector and generates a parity-bit vector based on a parity-check matrix H that is arranged in approximately lower-triangular form.

15. The encoder-implemented method of claim 14, wherein:
the parity-check matrix H is given by:

$$H = \begin{bmatrix} A & B & T \\ C & D & E \end{bmatrix}$$

where A, B, C, D, and E are sub-matrices of the parity-check matrix H;
T is the triangular matrix;
the input vector is generated by a first matrix-vector multiplication (MVM) step operating based on (i) sub-matrix A and (ii) the user-data vector; and
the output vector is applied to a second MVM step operating based on sub-matrix E.

16. The encoder-implemented method of claim 14, wherein the encoder is a low-density parity-check (LDPC) encoder.

17. The encoder-implemented method of claim 11, wherein each permutation coefficient corresponds to one of:
(i) reordering vector elements of a corresponding sub-vector;
(ii) leaving the corresponding sub-vector unchanged; and
(iii) replacing the corresponding sub-vector with a zero sub-vector.

18. The encoder-implemented method of claim 17, wherein reordering the vector elements comprises cyclically shifting the vector elements by a specified number of vector elements.

19. The encoder-implemented method of claim 17, wherein reordering the vector elements comprises applying the vector elements to an Omega network that reorders the elements based on the permutation coefficient.

20. The encoder-implemented method of claim 17, wherein reordering the vector elements comprises applying the vector elements to a Benes network that reorders the elements based on the permutation coefficient.

* * * * *